(12) United States Patent
Mizukane et al.

(10) Patent No.: US 8,004,325 B2
(45) Date of Patent: Aug. 23, 2011

(54) SEMICONDUCTOR DEVICE HAVING CONTROLLED DLL START-UP PERIOD

(75) Inventors: Yoshio Mizukane, Chuo-ku (JP); Hiroki Fujisawa, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 134 days.

(21) Appl. No.: 12/469,265

(22) Filed: May 20, 2009

(65) Prior Publication Data
US 2009/0289677 A1 Nov. 26, 2009

(30) Foreign Application Priority Data
May 22, 2008 (JP) .................................. 2008-133923

(51) Int. Cl.
*H03L 7/06* (2006.01)

(52) U.S. Cl. ........... 327/156; 327/147; 327/158; 326/30

(58) Field of Classification Search .................. 327/147, 327/156, 158; 326/30
See application file for complete search history.

(56) References Cited

U.S. PATENT DOCUMENTS

| 6,504,408 B1 * | 1/2003 | von Kaenel ................... 327/158 |
| 2006/0164139 A1 * | 7/2006 | Chong et al. ................. 327/158 |
| 2007/0103188 A1 | 5/2007 | Hosoe et al. |

FOREIGN PATENT DOCUMENTS

JP 2007-115366 A 5/2007

* cited by examiner

*Primary Examiner* — Lincoln Donovan
*Assistant Examiner* — John W Poos
(74) *Attorney, Agent, or Firm* — Sughrue Mion, PLLC

(57) ABSTRACT

A device in which a clock generation circuit is connected to a counter circuit for controlling operation timing of a DLL circuit or the like, and the counter circuit is intermittently operated by intermittently supplying a clock signal to the counter circuit from the clock generation circuit.

23 Claims, 11 Drawing Sheets

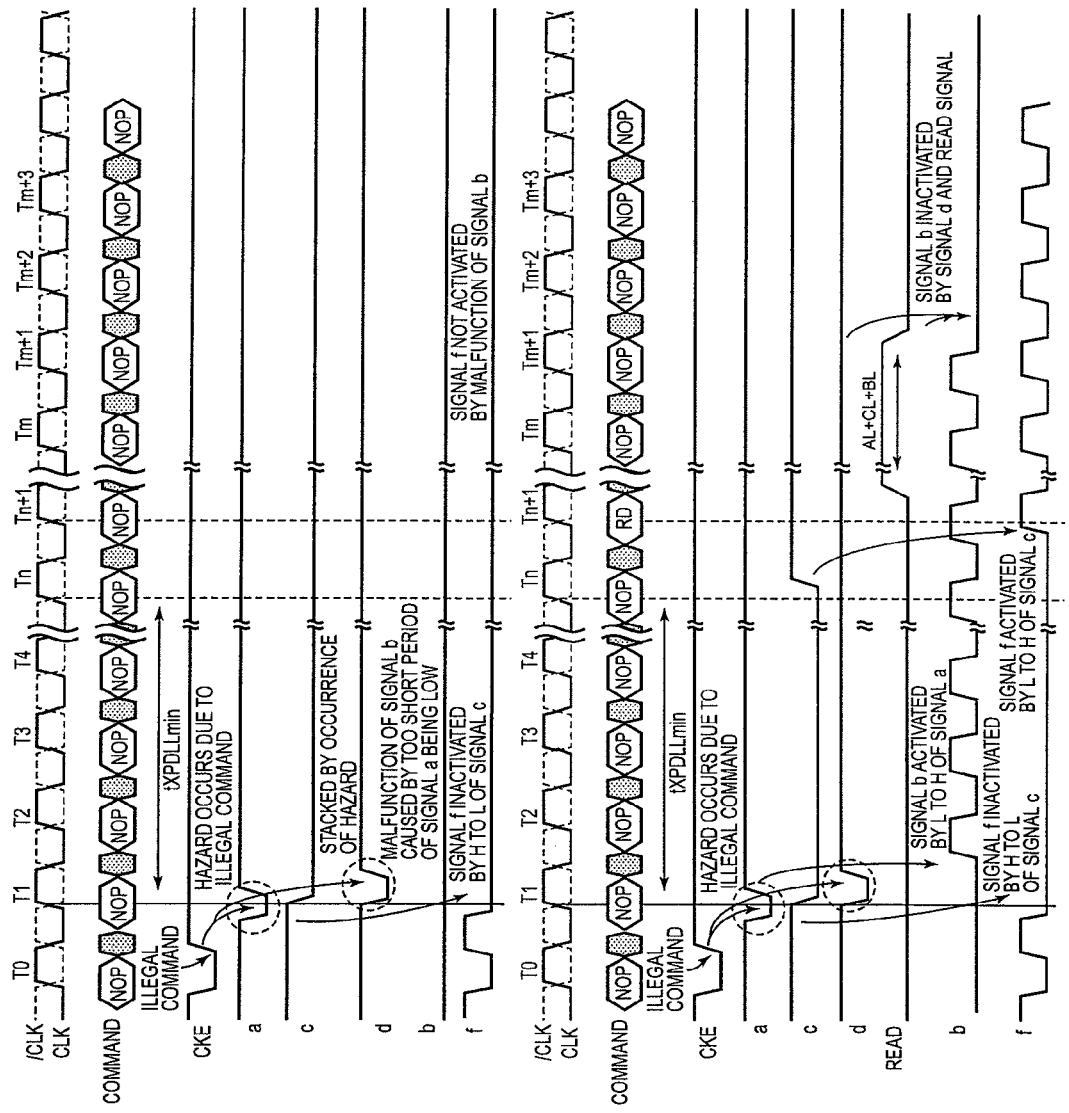

US 8,004,325 B2

SEMICONDUCTOR DEVICE HAVING CONTROLLED DLL START-UP PERIOD

This application is based upon and claims the benefit of priority from Japanese patent application No. 2008-133923, filed May 22, 2008, the disclosure of which is incorporated herein in its entirety by reference.

BACKGROUND OF THE INVENTION

1. Field of the Invention

This invention relates to a device, especially, a DLL (Delay Locked Loop) circuit unit for use in a semiconductor memory such as a DRAM chip comprising a DLL circuit mounted thereon.

2. Description of Related Art

A DDR-SDRAM (Double Data Rate-Synchronous Dynamic Random Access Memory) employs a DLL circuit, which generates internal clock signals in synchronization with external clock signals, for minimizing the delay in operation within the memory.

After being turned ON, DLL circuits require a predetermined period before being able to output stable internal clock signals, and this period is hereafter referred to as the "start-up period".

In other words, DLL circuits require the start-up period to transit from the non-operating state to the operating state.

Japanese Laid-Open Patent Publication No. 2007-115366 (Patent Document 1), for example, describes a semiconductor device comprising a counter circuit which counts the period required for a DLL circuit to stabilize its operation, for example, tXPDLL (the period required to enable input of a read or synchronous mode ODT (On Die Termination) from exit from the slow precharge power-down mode), and masks the DLL circuit during this period.

SUMMARY

However, since the counter circuit as described in Patent Document 1 must be operated constantly, there still is a room for improvement in view of power saving.

The present invention seeks to solve one or more of the above problems, or to improve upon those problems at least in part.

In order to achieve the object above, In one embodiment, there is provided a device comprising: a DLL circuit that generates an internal clock signal based on an input signal inputted externally; a clock generation circuit that generates a first clock signal based on the input signal; and a counter circuit that counts the first clock signal supplied from the clock generation circuit in order to obtain a start-up period required for the DLL circuit to transit from a non-operating state to an operating state, supplies the DLL circuit with a DLL output control signal to inactivate the internal clock signal during the start-up period, and supplies the clock generation circuit with a clock generation control signal to activate or inactivate the first clock signal.

In another embodiment, there is provided a device comprising: an internal circuit; a DLL circuit to generate a first clock signal; a counter circuit to control to supply the first clock signal to the internal circuit and to be inactivated after allowing to supply the first clock signal to the internal circuit.

This invention thus provides a counter circuit unit capable of achieving power saving by intermittently operating a DLL circuit controlling counter circuit by means of a clock generation circuit.

BRIEF DESCRIPTION OF THE DRAWINGS

The above features and advantages of the present invention will be more apparent from the following description of certain preferred embodiments taken in conjunction with the accompanying drawings, in which:

FIG. 13A is a timing chart for explaining operation of the counter circuit unit 1; and FIG. 13B is a timing chart for explaining operation of the counter circuit unit 1b.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
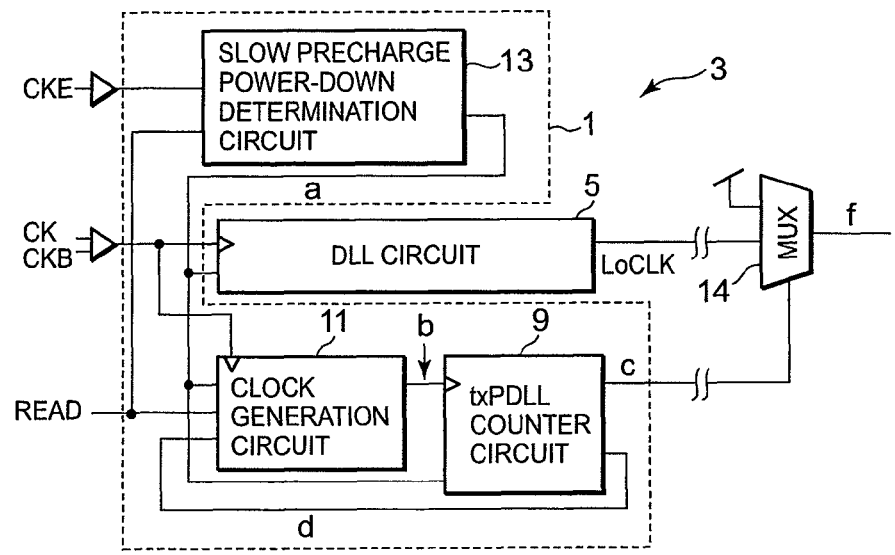
FIG. 1 is a block diagram showing a DLL circuit unit 3 according to a first embodiment of this invention.

Referring to FIG. 1, a schematic configuration of a DLL circuit unit 3 comprising a counter circuit unit 1 of this invention and a DLL circuit 5 will be described.

As shown in FIG. 1, the DLL circuit unit 3 as a device comprises a DLL circuit 5 generating an internal clock signal LoCLK corresponding to a clock signal CK (input clock signal) when a clock enable signal CKE is asserted, and a counter circuit unit 1 connected to the DLL circuit 5 and masking the DLL circuit 5 (i.e., inactivating the internal clock signal LOCLK) for a predetermined period required for the DLL circuit 5 to start up (i.e., to assume a second logic level, that is H level here) from its non-operating state (i.e., a first logic level, that is L level here). This period corresponds, in this example, to tXPDLL (the period required to enable input of a read or synchronous mode ODT command from exit from the slow precharge power-down mode (hereafter, referred to as the start-up period)).

The counter circuit unit 1 comprises a tXPDLL counter circuit 9 for counting tXPDLL, a clock generation circuit 11 connected to the txPDLL counter circuit 9 and generating clocks for the tXPDLL counter circuit 9, a determination circuit (in this example, a slow precharge power-down determination circuit 13) connected to the DLL circuit 5, the tXPDLL counter circuit 9, and the clock generation circuit 11, and determining whether or not a CKE (clock enable) signal is a predetermined command signal, for example a signal instructing slow precharge power-down. The shown DLL circuit unit 3 further comprises a MUX (Multiplexer) circuit 14 connected to the DLL circuit 5 and the DLL counter circuit 9. The MUX (Multiplexer) circuit 14 operates as a selector.

Figure 2:
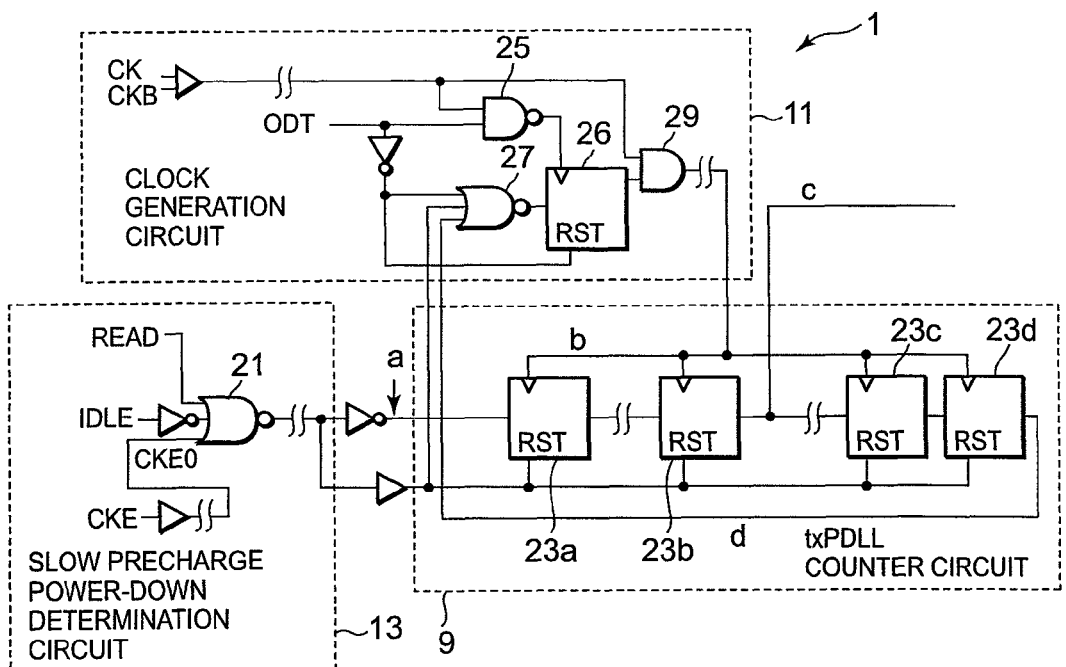
FIG. 2 is a circuit diagram showing a counter circuit unit 1 in FIG. 1.

Referring to FIG. 2, a description will be made on the circuits forming the FIG. 1 counter circuit unit 1 shown in FIG. 1.

A configuration of the slow precharge power-down determination circuit 13 will be described in the first place.

As shown in FIG. 2, the slow precharge power-down determination circuit 13 comprises a NOR circuit 21 which receives not only a READ signal and a CKE signal (first control signal), but also an inverted signal of an IDLE signal (semiconductor memory device state signal).

Next, a configuration of the tXPDLL counter circuit 9 will be described.

The tXPDLL counter circuit 9 comprises a plurality of flip-flop circuits 23a, 23b, 23c, and 23d which are connected in cascade from the first stage to the last stage. The last-stage flip-flop circuit 23d is connected to the clock generation circuit 11, while an intermediate flip-flop circuit (23b in this example) between the first stage and the last stage outputs a tXPDLL counter circuit output signal c (DLL output control signal) to the MUX circuit 14 (FIG. 1).

In this configuration, an output signal d (clock generation control signal) from the last-stage flip-flop circuit 23d is input to the clock generation circuit 11.

The tXPDLL counter circuit according to this embodiment is designed such that the tXPDLL counter output signal c to the MUX circuit 14 is output from a flip-flop circuit preceding the flip-flop circuit which outputs the counter output signal d to the clock generation circuit. This configuration provides a timing margin between activation of the internal clock signal LoCLK and inactivation of the tXPDLL counter clock signal b, whereby it is made possible to prevent malfunction in which the tXPDLL counter clock signal b is inactivated before activation of the internal clock signal LOCLK.

An inverted input signal a of the output signal (DLL state signal) from the slow precharge power-down determination circuit 13 is input to the first-stage flip-flop circuit 23a, while an output signal from the slow precharge power-down determination circuit 13 is supplied to the flip-flop circuits 23a, 23b, 23c, and 23d.

Further, the tXPDLL counter clock signals b from the clock generation circuit 11 are input to the flip-flop circuits 23a, 23b, 23c, and 23d so that the counter clock signals b are counted.

Next, a configuration of the clock generation circuit 11 will be described.

The clock generation circuit 11 comprises a NAND circuit 25 for receiving input of a clock signal CK and an ODT signal, the NAND circuit 25 being connected to a flip-flop circuit 26.

The clock generation circuit 11 further comprises a NOR circuit 27 for receiving input of an inverted signal of the ODT signal, an output signal d from the last-stage flip-flop circuit 23d, and an output signal from the slow precharge power-down determination circuit 13.

The clock generation circuit 11 further comprises an AND circuit 29 for receiving input of an output signal from the flip-flop circuit 26 and a clock signal CK.

The AND circuit 29 outputs a tXPDLL counter clock signal b (first clock signal) to the flip-flop circuits 23a, 23b, 23c, and 23d.

Next, referring to FIG. 3, operation of the DLL circuit unit 3 shown in FIG. 1 will be described.

Figure 3:
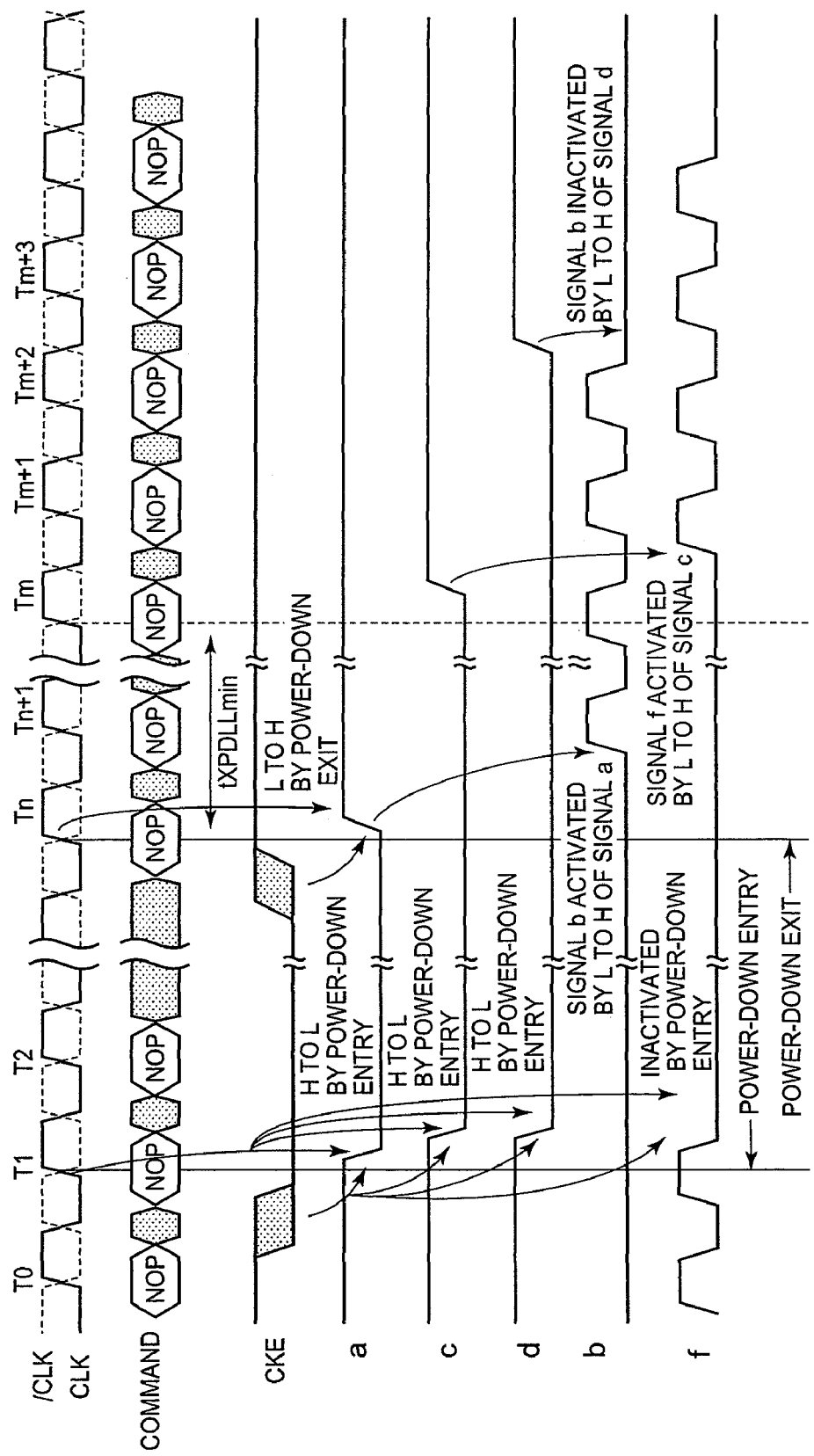
FIG. 3 is a timing chart for explaining operation of the DLL circuit unit 3 according to the first embodiment of this invention.

As shown in FIG. 3, in the counter circuit unit 1 according to the first embodiment, when the CKE signal externally input to the counter circuit unit 1 transits from "H" to "L", the input signal a and the tXPDLL counter circuit output signal c, and the output signal d also transit from "H" to "L", and thus the counter circuit unit 1 assumes the power-down mode (T1).

When the CKE signal then transits from "L" to "H" to cancel the power-down mode (that is, when the power-down mode is exited), and the input signal a also transits from "L" to "H", the tXPDLL counter clock signal b is activated and thus the tXPDLL counter circuit 9 starts its counting operation.

When the count value of the tXPDLL counter clock signals b counted by the tXPDLL counter circuit 9 reaches a predetermined value after the canceling of the power-down mode (Tm+2), the output signal d transits from "L" to "H" and the tXPDLL counter clock signal b again becomes inactive.

This means that the counter circuit unit 1 activates the tXPDLL counter clock signal b only for the period in which the output signal d from the tXPDLL counter circuit 9 is at "L" and the input signal a from the slow precharge power-down determination circuit 13 is at "H", so that the tXPDLL counter circuit 9 can be stopped except for a predetermined period (for the tXPDLL period or a predetermined timing margin period following the tXPDLL period).

Accordingly, the first embodiment of the invention can provide a semiconductor device in which the power consumption by operation of the tXPDLL counter circuit 9 is reduced in comparison with a prior art in which the tXPDLL counter circuit 9 is operated constantly (e.g. Patent Document 1).

In the first embodiment, as described above, the counter circuit unit 1 comprises a tXPDLL counter circuit 9, a clock generation circuit 11, and a slow precharge power-down determination circuit 13, and is designed such that the clock generation circuit 11 receives input of an output signal d from the txPDLL counter circuit 9.

According to this configuration, the clock generation circuit 11 can be operated only when the output signal d from the tXPDLL counter circuit 9 is at "H", or only for the start-up period of the DLL circuit 5, and hence the power consumption by operation of the tXPDLL counter circuit 9 can be reduced compared to conventional techniques.

In the first embodiment, as described above, the tXPDLL counter circuit 9 is connected to the clock generation circuit 11 outputting the clock signal b comprising a specific clock frequency, while the clock generation circuit 11 is controlled by the output signal d from the tXPDLL counter circuit 9, whereby the tXPDLL counter circuit 9 can be intermittently operated. This makes it possible to reduce the power consumption.

Next, a counter circuit unit 1a according to a second embodiment of this invention will be described with reference to FIGS. 4 to 11.

In the following description of the second embodiment, those elements comprising the same functions as the elements in the first embodiment are assigned with the same reference numerals, and description thereof will be omitted.

Figure 4:
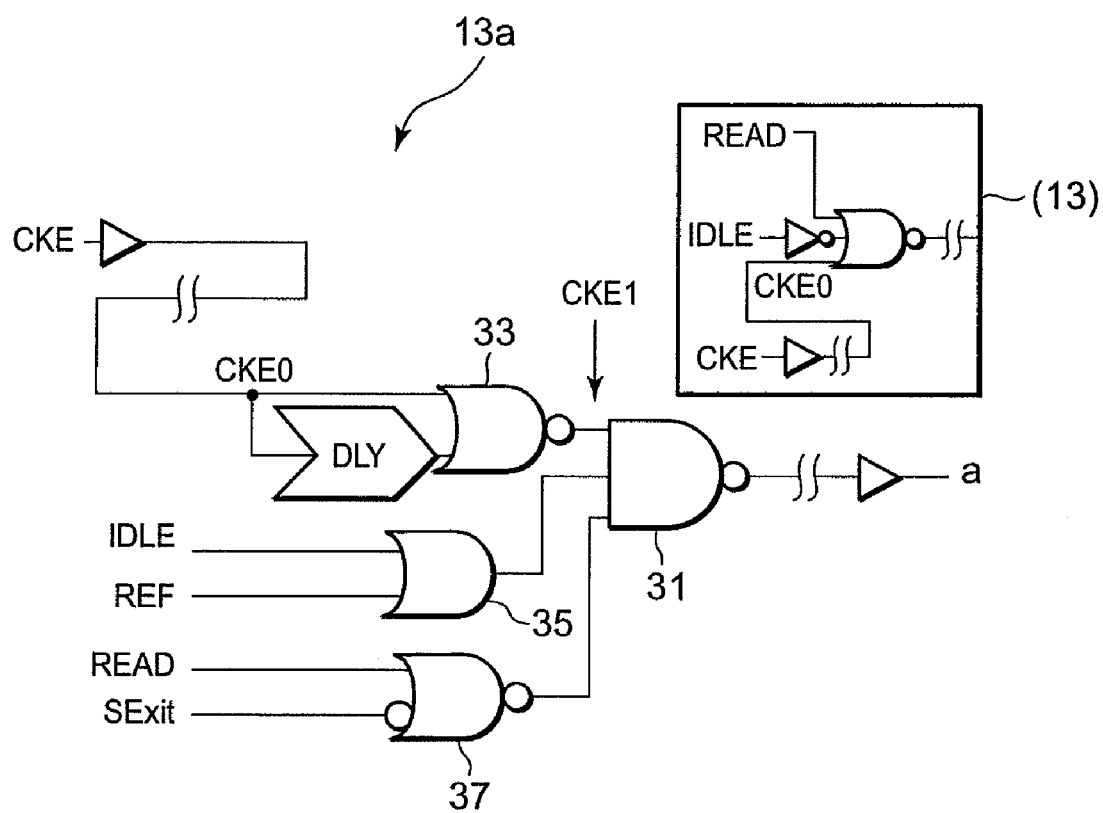
FIG. 4 is a circuit diagram showing a slow precharge power-down determination circuit 13a of a counter circuit unit 1a according to a second embodiment of this invention.
Figure 5:
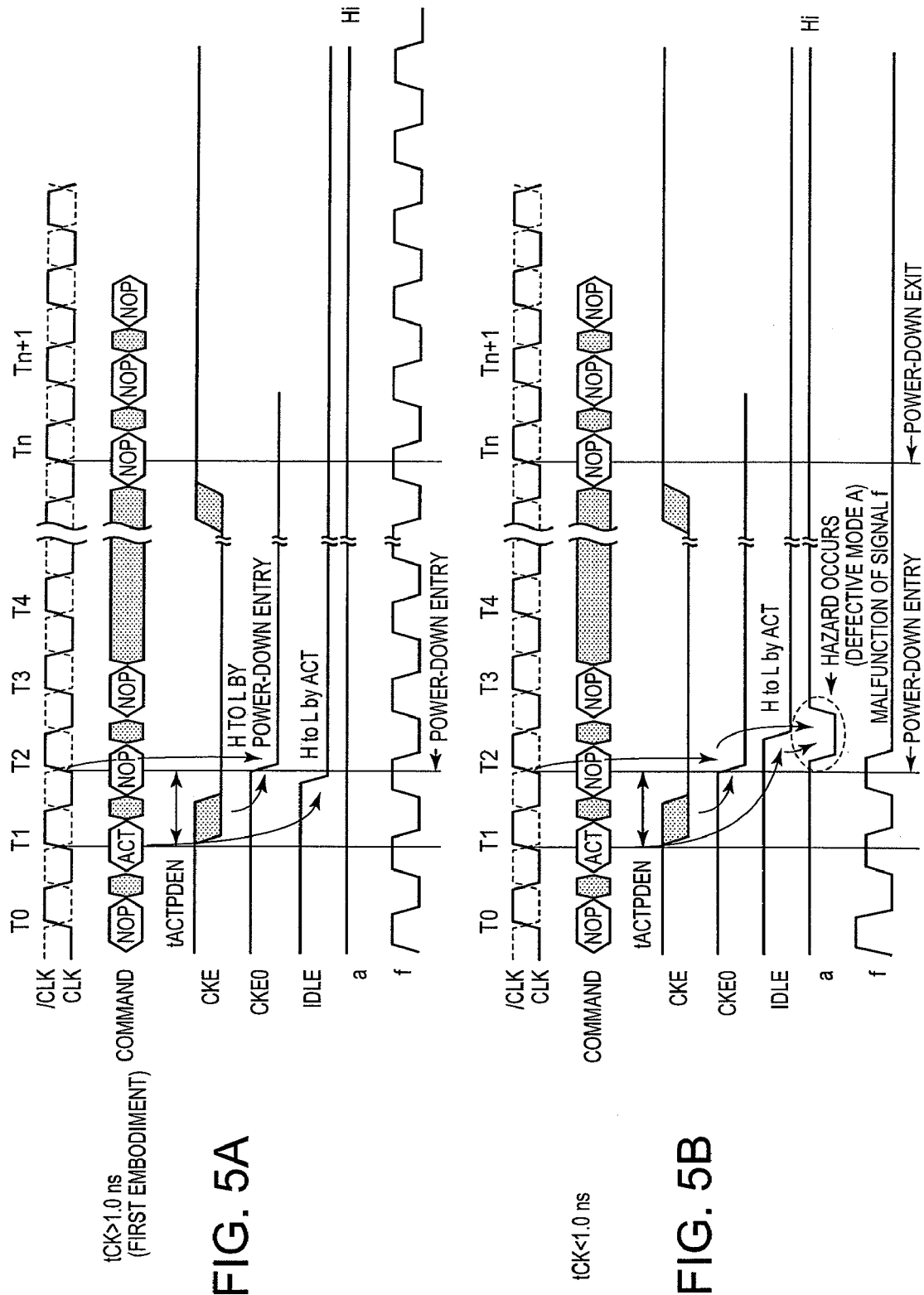
FIG. 5A is a timing chart for explaining the case in which the counter circuit unit 1 according to the first embodiment operates normally.
FIG. 5B is a timing chart for explaining the case in which a defective mode occurs in the counter circuit unit 1 according to the first embodiment.

The counter circuit unit 1a according to the second embodiment comprises a slow precharge power-down determination circuit which is configured in a slightly different manner from the slow precharge power-down determination circuit 13 according to the first embodiment shown in FIG. 2. Therefore, FIG. 4 shows only the slow precharge power-down determination circuit of the counter circuit unit 1a according to the second embodiment, being denoted by the reference numeral 13a. As shown in FIG. 4, the slow precharge power-down determination circuit 13a comprises, in addition to the components shown in FIG. 2, a delay element DLY for delaying the CKE signal, an OR circuit 35 for receiving input of an IDLE signal and a REF signal, and a NAND circuit 31 provided at the output portion of the slow precharge power-down determination circuit 13a.

More specifically, the precharge power down determination circuit 13a shown in FIG. 4 comprises a NAND circuit 31 connected to a NOR circuit 33, the OR circuit 35, and a NOR circuit 37, and the NAND circuit 31 receives input of output signals from these circuits.

Like the first embodiment, an output signal from the NAND circuit 31 is output, as an output signal a, to the DLL circuit 5, the tXPDLL counter circuit 9, and the clock generation circuit 11.

The NOR circuit 33 receives input of a non-delayed signal CKE0 (first internal control signal), and a signal obtained by delaying the signal CKE0 by the delay element DLY (second internal control signal).

On the other hand, an IDLE signal and a REF signal are input to the OR circuit 35. As a result, a logical sum output of the IDLE signal and the REF signal is input to the NAND circuit 31 as a semiconductor memory device state signal.

A READ signal and an inverted signal of a SExit signal are input to the NOR circuit 37, and an output from the NOR circuit 37 is supplied to the NAND circuit 31.

Referring to FIGS. 6 to 11, description will be made on reasons why the configuration described above is employed in this invention.

The following description will be made on the assumption that this invention is applied to a DRAM.

The DRAM's power-down modes comprise two types of power-down modes: a precharge power-down mode in which the DRAM transits from the idle state, and an active power-down mode in which the DRAM transits from the active state.

In a conventional DRAM, operation of the DLL circuit 5 is controlled to be stopped in either of the two power-down modes. According to Patent Document 1, for example, the counter circuit continues to count clocks even when operation of the DLL circuit 5 is stopped.

Recently, however, control methods have become to be employed, in which the DLL circuit 5 is controlled to operate differently between the precharge power-down mode and the active power-down mode.

For example, the control method may be such that operation of the DLL circuit 5 is stopped in the precharge power-down mode, but operation of the DLL circuit 5 is not stopped in the active power-down mode.

However, when using such a method to control the operation and stoppage of the DLL circuit 5 so as to depend on both a state of the DRAM before transition and a command, malfunction of the DLL circuit 5 may occur due to a hazard caused by a delay in the internal state transition when the DLL circuit 5 enters the power-down mode after input of an active (ACT) command or refresh (REF) command.

Explaining more specifically the term "hazard" as used herein, the term "hazard" herein means a state, for example, in which as shown in FIG. 5B, a short pulse has occurred in the input signal a as illustrated in the waveform when tCK<1.0 ns in the first embodiment (when the DLL circuit 5 operates normally without causing a hazard, the input signal a assumes the waveform shown in FIG. 5A).

When a hazard (short pulse) occurs in the input signal a, some insufficiently reset (RST) flip-flops will appear in the txPDLL counter circuit 9, resulting in a situation in which the output signal d from the txPDLL counter circuit 9, which should become "H" after a lapse of a certain time, becomes "H" before the lapse of such certain time.

The tXPDLL counter clock signal b of the tXPDLL counter circuit 9 is inactivated when the output signal d becomes "H". If the output signal d becomes "H" before the lapse of the certain time, however, the tXPDLL counter clock signal b will be inactivated even in a period in which the tXPDLL counter clock signal b should normally be activated, and thus an "H" signal that should normally be transmitted through the flip-flops in the tXPDLL counter circuit 9 will not reach the tXPDLL counter circuit output signal c.

Consequently, if the hazard described above occurs, the tXPDLL counter circuit output signal c for activating the DLL output signal f does not become "H", possibly resulting in malfunction (stack) in which the DLL output signal f remains constantly inactive.

The probability of occurrence of such malfunction is believed to become higher particularly as the operating frequency is increased (for example, when tCK<1.0 ns as shown in FIG. 5B).

There are possibly three defective modes as described below in which the above-mentioned problems occur.

Defective Mode A: ACT to Power-Down (FIG. 6)

When an ACT command is input in the idle state and then the power-down mode is entered, the power-down mode is normally entered after the internal state has transited to the bank active state, and thus the state normally transits directly to the active power-down mode without stopping the DLL circuit 5.

Figure 6:
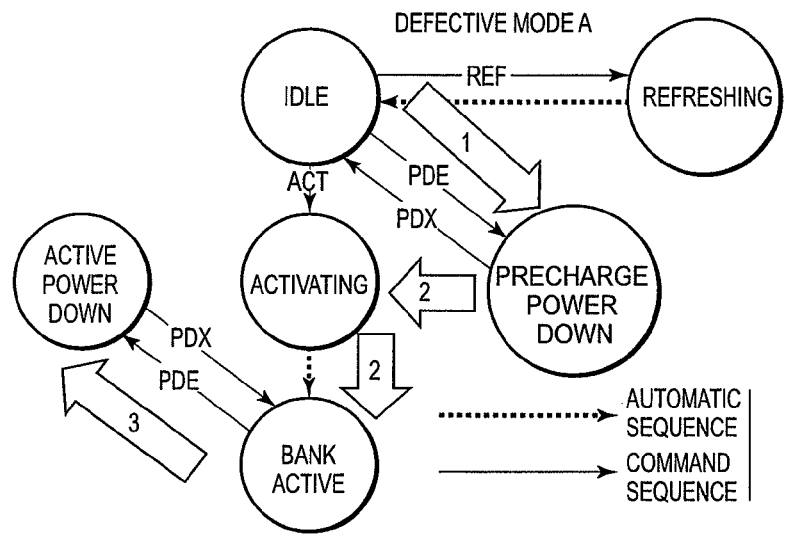
FIG. 6 is a diagram showing state transition of a defective mode A.

However, if in the first embodiment, as shown in FIG. 6, it takes so much time to transit from the idle state to the bank active state that the power-down mode is entered during the activating process (before the bank active state is recognized), the precharge power-down mode may be entered in the course of transition from the idle state to the bank active state (see Table 1).

TABLE 1

| First Embodiment | | | |
|---|---|---|---|
| CKE0 | H | L | L |
| IDLE | H | H | L |
| a | H | L | H |
| DRAM state | Idle | Precharge Power-Down | Active Power-Down |
| Second Embodiment | | | |
| CKE0 | H | L | L |
| CKE1 | H | H | L |
| IDLE | H | H | L |
| a | H | H | H |
| DRAM state | Idle | Idle | Active Power-Down |

If this occurs, the entry to the precharge power-down mode causes a hazard to occur in the input signal a, indicating the stoppage of operation of the DLL circuit 5.

Defective Mode B: Refresh to Power-Down (FIG. 7)

When a REF command is input in the idle state and then the power-down mode is entered, the power-down mode is normally entered after the internal state has transited to the refreshing state. Therefore, the state normally transits directly to the active power-down mode, without stopping the DLL circuit 5 during the period from the input of the REF command to the entry to the power-down mode (state transition 3).

Figure 7:
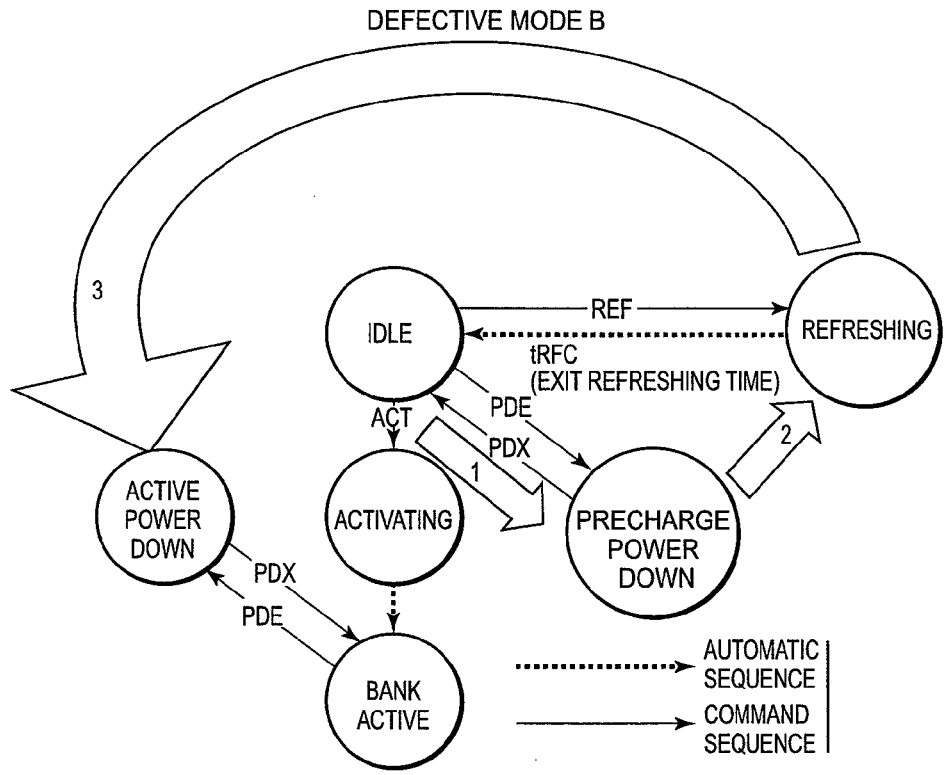
FIG. 7 is a diagram showing state transition of a defective mode B.

However, if in the first embodiment, as shown in FIG. 7, it takes so much time to transit from the idle state to the refreshing state that the power-down mode is entered before the refreshing state is recognized (state transition 1), the precharge power-down mode may be entered in the course of transition from the idle state to the refreshing state (state transition 2) (see Table 2).

TABLE 2

| First Embodiment | | | |
|---|---|---|---|
| CKE0 | H | L | L |
| IDLE | H | H | L |
| a | H | L | H |
| DRAM state | Idle | Precharge Power-Down | Active Power-Down |
| Second Embodiment | | | |
| CKE0 | H | L | L |
| CKE1 | H | H | L |
| REF | L | H | H |
| IDLE | H | H | L |
| a | H | L | L |
| DRAM state | Idle | Precharge Power-Down | Active Power-Down |

If this occurs, the entry to the precharge power-down mode causes a hazard to occur in the input signal a, indicating the stoppage of operation of the DLL circuit 5.

Figures 9A, 9B:
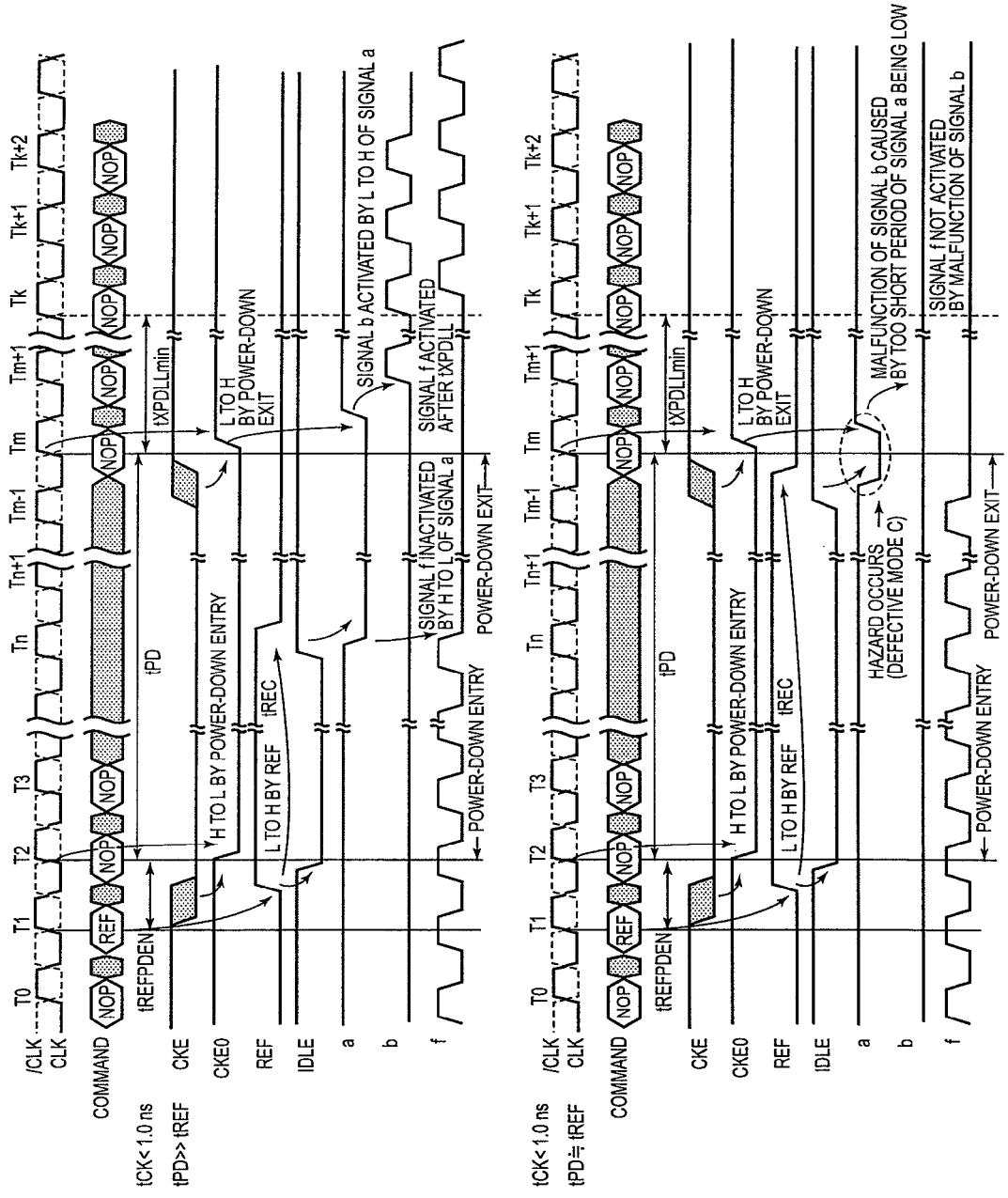
FIG. 9A is a timing chart of the counter circuit unit 1 in FIG. 1.
FIG. 9B is a timing chart for explaining the case in which a defective mode occurs in the counter circuit unit 1 according to the first embodiment.
Figure 10:
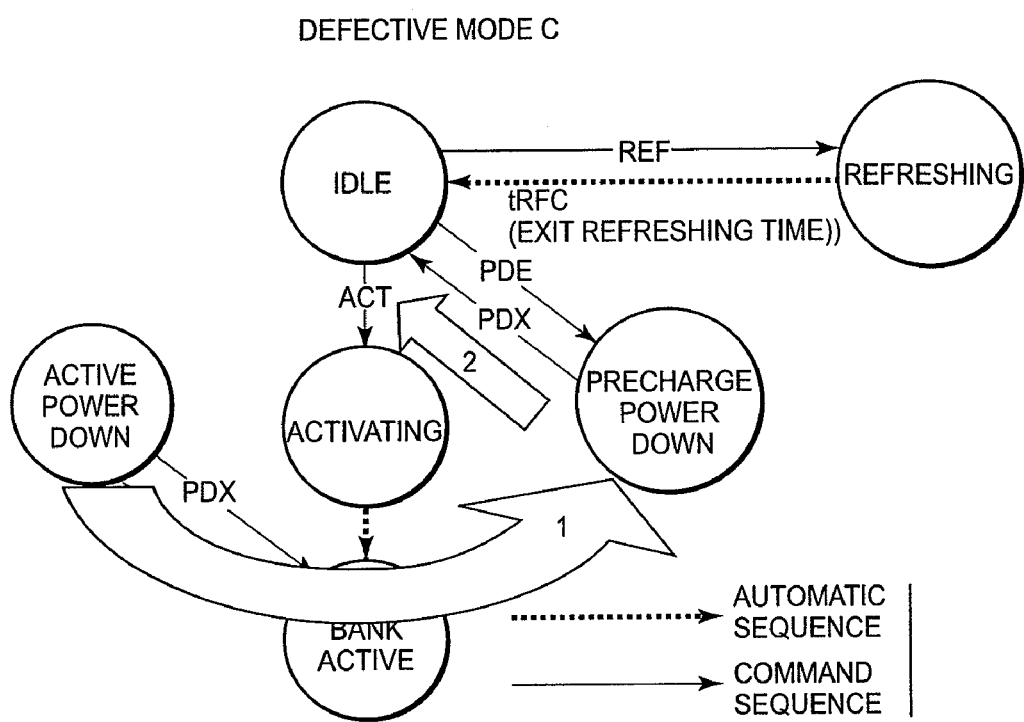
FIG. 10 is a diagram showing state transition of a defective mode C.

Defective Mode C: (FIG. 9B, FIG. 10)

If the power-down mode is entered in the refreshing state, the active power-down mode remains valid during refreshing operation. The refreshing operation is then terminated after a lapse of predetermined time (tRFC), and the mode automatically transits to the precharge power-down mode (see FIG. 9A and FIG. 10).

The DLL circuit 5 should normally continue to operate when the power-down mode is canceled substantially at the same timing as the termination of the refreshing operation.

However, according to the first embodiment, as described above, there is a risk that the precharge power-down mode may be entered in the course of transition by the automatic transition to the precharge power-down mode (automatic transition of the REF signal from "H" to "L") (see Table 3).

When the power-down mode is canceled substantially at the same timing as the termination of the refreshing operation, the power-down mode is canceled after the entry to the precharge power-down mode for a brief period of time, possibly resulting in occurrence of a hazard in the signal a.

If this occurs, the entry to the precharge power-down mode produces a hazard signal in the input signal a, indicating the stoppage of the DLL circuit 5.

In order to avoid the problems as described above, the slow precharge power-down determination circuit 13a according to the second embodiment is configured prevent the occurrence of a hazard when the power-down mode is entered after input of an ACT command or REF command.

Figure 8:
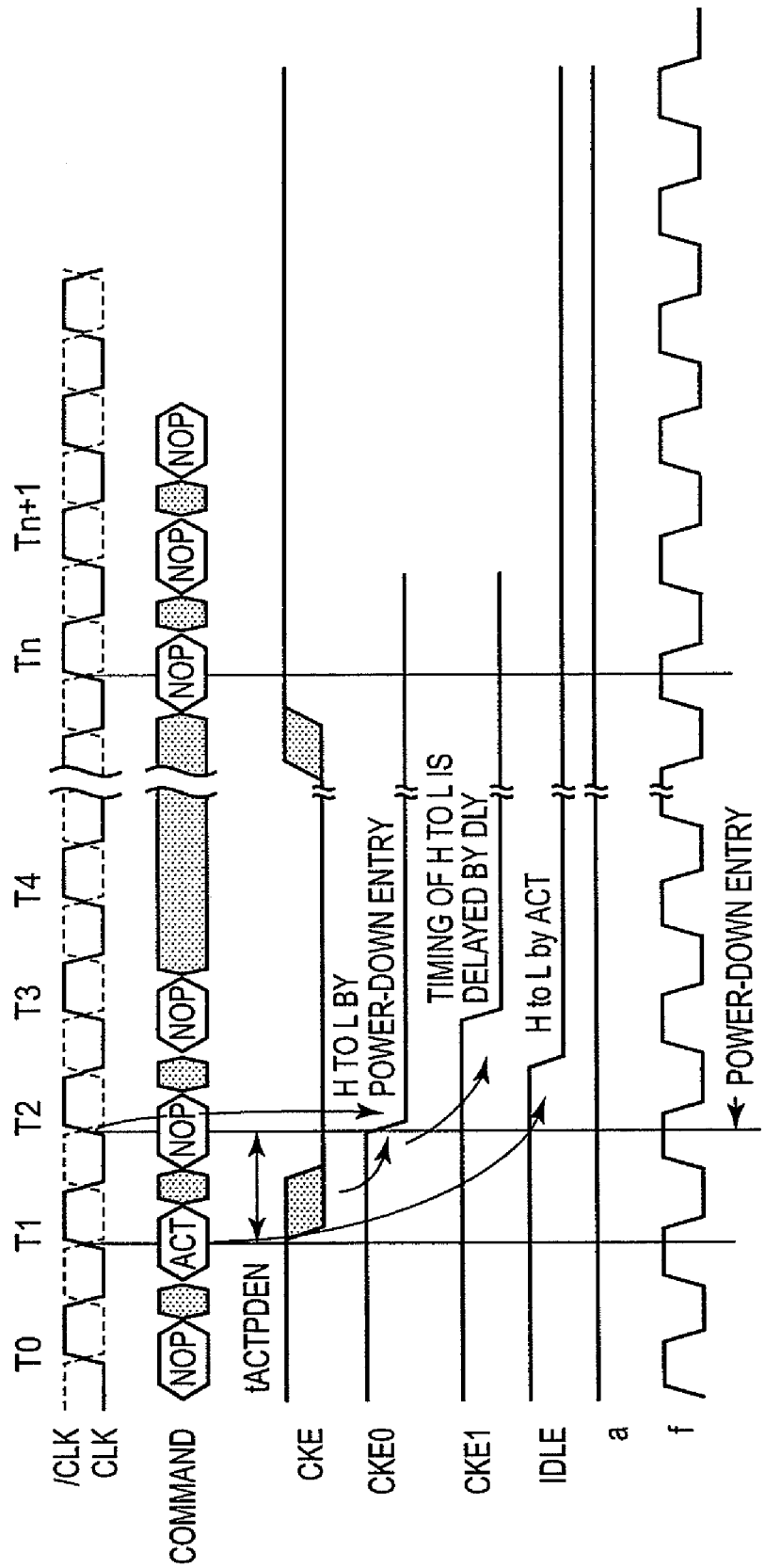
FIG. 8 is a timing chart for explaining operation of the counter circuit unit 1a according to the second embodiment.
Figure 11:
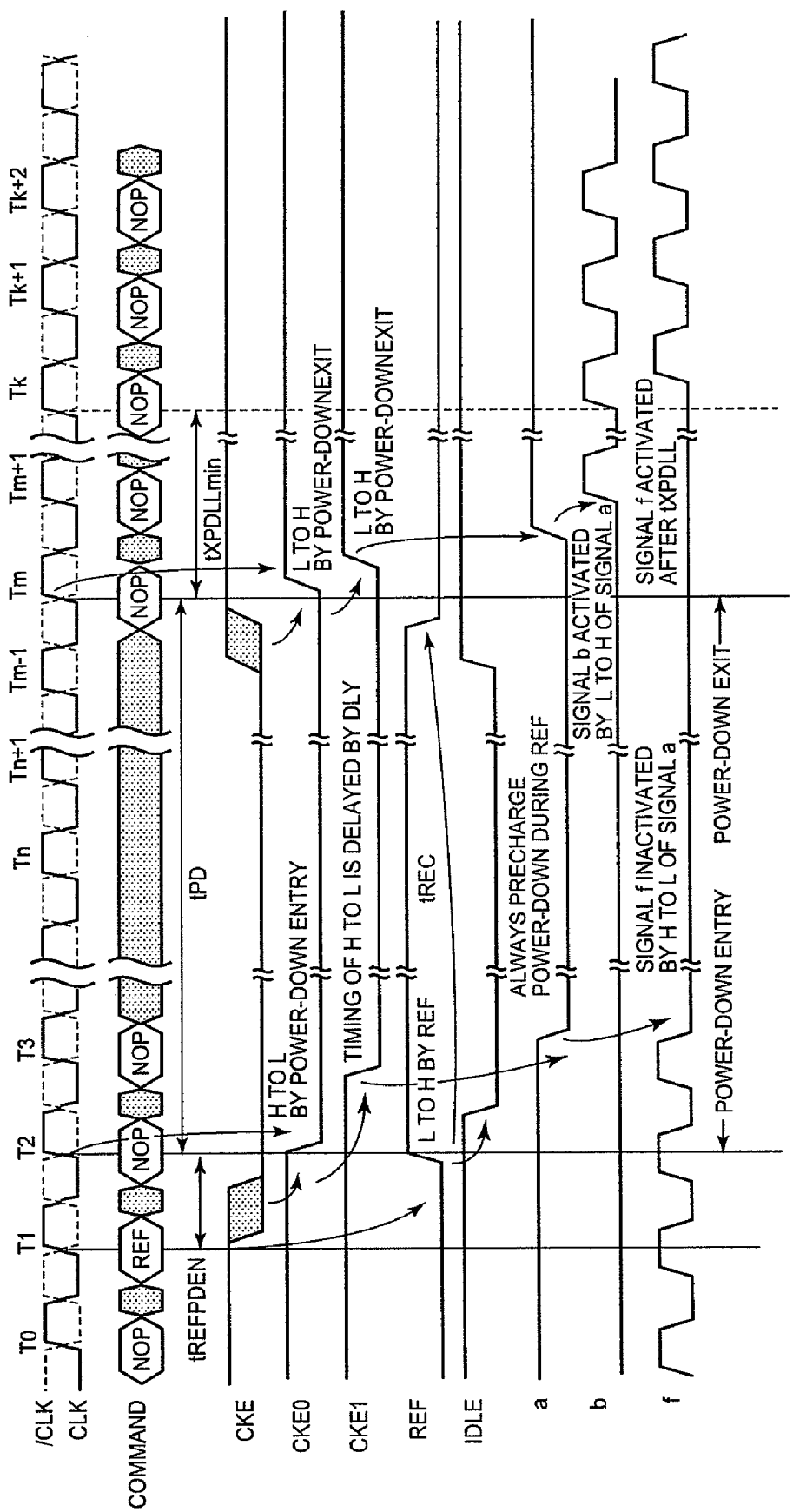
FIG. 11 is a timing chart for explaining operation of the counter circuit unit 1a according to the second embodiment of this invention.

Specifically, as described above, the configuration of the slow precharge power-down determination circuit 13a is changed as shown in FIG. 4, such that the fall of the internal clock enable signal CKE0 for entry to the power-down mode is delayed until the IDLE signal indicating the internal state becomes "L" as shown in FIG. 8 and FIG. 11.

This configuration makes it possible to prevent the tXP-DLL counter clock signal b from being inactivated at a wrong timing by a hazard caused by a delay in the internal state transition when the power-down mode is entered after input of an ACT command or REF command (see Table 1).

Further, as shown in FIG. 4, an OR logic between the IDLE signal and the REF signal (OR circuit 35) is input to the NAND circuit 31 as one of the three inputs thereto, so that the precharge power-down mode can be held constantly during the refresh operation. This makes it possible to prevent the occurrence of the hazard of the type of the above-described defective mode C as well (see Table 3).

TABLE 3

| First Embodiment | | | |
|---|---|---|---|
| CKE0 | L | L | H |
| IDLE | L | H | H |
| a | H | L | H |
| DRAM state | Active Power-Down | Precharge Power-Down | Idle |
| Second Embodiment | | | |
| CKE0 | L | L | H |
| CKE1 | L | L | H |
| REF | H | H | L |
| IDLE | L | H | H |
| a | L | L | H |
| DRAM state | Precharge Power-Down | Precharge Power-Down | Idle |

Accordingly, even if the second embodiment of this invention is applied to a DRAM comprising two different types of power-down modes, the risk can be avoided that the DLL output signal f is always inactive. Thus, the tXPDLL counter circuit 9 can be stopped without stacking the DLL circuit 5, and this invention can provide a semiconductor device in which the power consumption by operation of the tXPDLL counter circuit 9 is reduced compared to the conventional techniques in which the tXPDLL counter is constantly operated.

According to the second embodiment, as described above, the counter circuit unit 1 comprises a tXPDLL counter circuit 9, a clock generation circuit 11, and a slow precharge power-down determination circuit 13a, the clock generation circuit 11 being configured to receive input of the output signal d from the tXPDLL counter circuit 9.

Accordingly, the second embodiment provides the same effects as those of the first embodiment.

According to the second embodiment, the slow precharge power-down determination circuit 13a comprises a delay element DLY for delaying the signal CKE.

This makes it possible to prevent the tXPDLL counter clock signal b from being inactivated at a wrong timing by a hazard caused by delay of internal state transition when the power-down mode is entered after input of an ACT command or REF command.

Further, according to the second embodiment, the slow precharge power-down determination circuit 13a comprises an OR circuit 35 for receiving input of an IDLE signal and a REF signal.

Therefore, the occurrence of the hazard of the type of the above-described defective mode C can be prevented by keeping the precharge power-down mode constantly during the refresh operation.

Next, referring to FIGS. 12 and 13, a DLL circuit unit 3b according to a third embodiment of this invention will be described.

The DLL circuit unit 3b according to the third embodiment comprises a clock generation circuit 11a which is configured such that a txPDLL counter clock signal b is inactivated by an AND logic between an output signal d from a tXPDLL counter circuit 9 and a burst end signal of a subsequent read command.

Specifically, like the second embodiment, the third embodiment aims at preventing the DLL output signal f from being constantly inactive even if a hazard (short pulse) occurs in the input signal a when the period tPD from entry to the power-down mode to exit from the power-down mode is shorter than a specified standard period (that is, when the power-down exit command is input at an illegal timing).

In the description of the third embodiment below, elements comprising the same functions as those of the first embodiment and second embodiment are assigned with the same reference numerals, and description thereof will be omitted.

Figure 12:
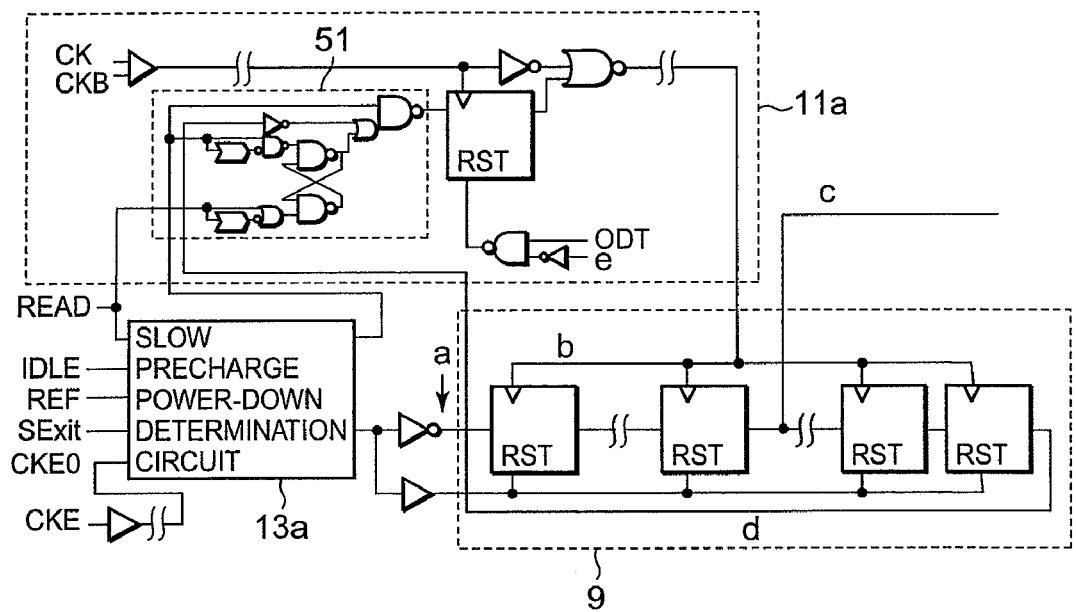
FIG. 12 is a circuit diagram showing a counter circuit unit 1b according to a third embodiment of this invention.

As shown in FIG. 12, the clock generation circuit 11a comprises a logic circuit 51.

The logic circuit 51 is configured to generate a control signal for controlling the flip-flops by logically operating an output signal d from the tXPDLL counter circuit 9, a read command signal (specifically, a burst end signal of the subsequent read command), and an output from the slow precharge power-down determination circuit 13a, and to thereby inactivate the tXPDLL counter clock signal b.

On the other hand, the output signal d from the tXPDLL counter is supplied to the clock generation circuit 11a in the same manner as in the other embodiments.

Thus, as shown in FIG. 13B, the configuration to logically operate the output signal d and the burst end signal of the subsequent read command to thereby inactivate the tXPDLL counter clock signal b prevents the malfunction of the tXPDLL counter clock signal b even if a hazard is output to the input signal a due to an illegal command or the like (in the third embodiment, an example is shown in which the period tPD from the power-down entry to the power-down exit is shorter than a specified standard period) in the slow precharge power-down determination circuit 13a (see FIG. 13A), eliminating the risk of the problem of the DLL output signal f being constantly inactive.

If the power-down mode is entered after the exit from the power-down mode without receiving even one read command, the logic circuit 51 forcibly stops clock signals supplied to the tXPDLL counter circuit 9 to thereby reduce the current during the power-down mode. In a practical use, the current reduction is possible since the power-down mode is automatically entered if no read command is input after exit from the power-down mode.

In this manner, the tXPDLL counter circuit 9 can be stopped without stacking the DLL circuit 5, and thus this invention can provide a semiconductor device in which the power consumption by operation of the tXPDLL counter circuit 9 is reduced compared to conventional techniques in which tXPDLL counter is constantly operated.

Here, brief description will be made on a reason why a burst end signal of a read command is used in the logic circuit 51.

According to definition of specifications, a command which becomes inputtable only after the operation of the DLL circuit 5 is stabilized is a read command or a synchronous mode ODT command.

However, since the ODT command comprises not only a synchronous mode ODT command but also an asynchronous mode ODT command, it is difficult to use the ODT command.

Further, if the timing of input of a read command instead of a burst end signal is used, the tXPDLL counter circuit 9 may be stopped before completing its operation.

Therefore, according to the third embodiment, the logic circuit 51 uses a burst end signal of a read command so as to ensure a margin before its operation is stabilized.

According to the third embodiment, as described above, the counter circuit unit 1 comprises a tXPDLL counter circuit 9, a clock generation circuit 11, and a slow precharge power-down determination circuit 13a, the clock generation circuit 11 being configured to receive input of an output signal d from the tXPDLL counter circuit 9.

Therefore, the third embodiment provides the same effects as those of the second embodiment.

The clock generation circuit 11a according to the third embodiment is configured to logically operate an output signal d from the txPDLL counter circuit 9 and a burst end signal of a subsequent read command to thereby inactivate the tXPDLL counter clock signal b.

According to this configuration, even if a hazard is output to the slow precharge power-down determination circuit 13a due to an illegal command or the like and the input signal a becomes "L" (the DLL circuit 5 is stopped) at an unintended timing, the tXPDLL counter clock signal b will not be inactivated and hence the DLL circuit 5 will not be stacked.

Although the inventions has been described above in connection with several preferred embodiments thereof, it will be appreciated by those skilled in the art that those embodiments are provided solely for illustrating the invention, and should not be relied upon to construe the appended claims in a limiting sense.

For example, although the description of the embodiments above has been made in terms of a case in which this invention is applied to a DRAM, this invention is not limited to this but is applicable to any other circuits which require using a DLL circuit for switching from an ODT asynchronous signal to an ODT synchronous signal. Further, although the description above has been made only on a counter circuit unit for controlling a DLL circuit used for ODT, this invention is also applicable to various DLLs and PLL (Phase Locked Loop)s requiring some time to start normal operation.

This invention is applicable to a semiconductor package, semiconductor memory, and computer.

What is claimed is:
1. A device comprising:
a DLL circuit that generates an internal clock signal based on an input signal inputted externally;
a clock generation circuit that generates a first clock signal based on the input signal; and
a counter circuit that counts the first clock signal supplied from the clock generation circuit in order to obtain a start-up period required for the DLL circuit to transition from a non-operating state to an operating state, supplies the DLL circuit with a DLL output control signal to inactivate the internal clock signal during the start-up period, and supplies the clock generation circuit with a clock generation control signal to activate or inactivate the first clock signal.

2. The device as claimed in claim 1, wherein the clock generation circuit intermittently activates the first clock signal in response to the clock generation control signal.

3. The device as claimed in claim 1, wherein the clock generation circuit activates the first clock signal only for the start-up period and a predetermined period following the start-up period.

4. The device as claimed in claim 1, wherein the counter circuit comprises a plurality of unit circuits connected in cascade, outputs the DLL output control signal from one of the unit circuits placed in an intermediate-stage of the unit circuits, and outputs the clock generation control signal from one of the unit circuits placed in a last-stage of the unit circuits.

5. The device as claimed in claim 1, further comprising a semiconductor device including the DLL circuit, the clock generation circuit, the counter circuit and a determination circuit, the determination circuit receiving a first control signal inputted externally and a first state signal indicating a state of the semiconductor device and setting the DLL circuit to one of the non-operation state and operation state based on the first control signal and the first state signal.

6. The device as claimed in claim 5, wherein the first control signal is a signal that controls a power-down mode of the semiconductor device, and the first state signal is an IDLE signal indicating an idle state of the semiconductor device.

7. The device as claimed in claim 6, wherein the determination circuit receives a second state signal that indicates a refresh state of the semiconductor device and sets the DLL circuit to one of the non-operation state and operation state based on the first control signal, the first state signal and the second state signal.

8. The device as claimed in claim 7, wherein the determination circuit sets the DLL circuit to the non-operation state when the semiconductor device is set the power-down mode in the refresh state.

9. The device as claimed in claim 5, wherein the determination circuit comprises a delay circuit that delays the first control signal.

10. The device as claimed in claim 5, wherein the determination circuit outputs a DLL state signal and the clock generation circuit controls the first clock signal in response to the clock generation control signal and the DLL state signal.

11. The device as claimed in claim 1, wherein the clock generation circuit receives the first signal that indicates a burst end of a read operation and controls the first clock signal in response to the clock generation control signal and the first signal.

12. A device comprising:
an internal circuit;
a DLL circuit to generate a first clock signal;
a counter circuit to control to supply the first clock signal to the internal circuit and to be inactivated after allowing to supply the first clock signal to the internal circuit; and
a control circuit to control the DLL circuit in one of a non-operation state and an operation state in response to a control signal and a state of the internal circuit.

13. The device as claimed in claim 12, further comprising a clock generation circuit to supply a second clock signal to the counter circuit to activate the counter circuit.

14. The device as claimed in claim 13, wherein the counter circuit supplies a first signal to the clock generation circuit and the clock generation circuit inactivates the second clock signal in response to the first signal.

15. The device as claimed in claim 12, wherein the control circuit includes a delay circuit to generate a delayed control signal in response to the control signal and controls the DLL circuit in the one of the non-operation state and the operation state in response to the delayed control signal and the state of the internal circuit.

16. The device as claimed in claim 12, wherein the control circuit controls the DLL circuit in the non-operation state, when the control signal is inputted in a period in which the internal circuit is in an idle state.

17. The device as claimed in claim 12, wherein the control circuit controls the DLL circuit in the non-operation state, when the control signal is inputted in a period in which the internal circuit is in a refresh state.

18. The device as claimed in claim 12, wherein the control circuit resets the counter circuit in response to the control signal and a state of the internal circuit and activates the clock generation circuit in response to the control signal and a state of the internal circuit.

19. The device as claimed in claim 14, wherein the clock generation circuit inactivates the second clock signal in response to the first signal and a read command signal.

20. A device comprising:
a DLL circuit generating an internal clock signal; and
a selection circuit including a first input node coupled to the DLL circuit to receive the internal clock signal, a second input node coupled to receive a first signal, a selection node coupled to receive a selection signal, and an output node, the selection circuit selecting and outputting the internal clock signal at the output node in response to a first level of the selection signal and selecting and outputting the first signal at the output node in response to a second level of the selection signal.

21. The device as claimed in claim 20, wherein the first signal is maintained at substantially constant level.

22. The device as claimed in claim 20, further comprising a control circuit coupled to the selection node of the selection circuit to supply the selection signal, the control circuit including a counter circuit that counts a clock signal to determine a level of the selection signal, the counter circuit being deactivated to stop counting operation thereof during at least a part of a first period of time when the selection signal takes the first level.

23. The device as claimed in claim 22, wherein the control circuit further includes a counter clock generating circuit which supplies the clock signal to the counter circuit, wherein the counter clock generating circuit stops supplying the counter clock signal to the counter circuit during at least the part of the first period of time.

* * * * *